(12) United States Patent
Mellein (10) Patent No.: US 10,393,786 B2
(45) Date of Patent: Aug. 27, 2019

(54) TEST SYSTEM AND METHOD FOR OVER THE AIR (OTA) MEASUREMENTS BASED ON RANDOMLY ADJUSTED MEASUREMENT POINTS

(71) Applicant: Rohde & Schwarz GmbH & Co. KG, Munich (DE)

(72) Inventor: Heinz Mellein, Haar (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 15/843,538

(22) Filed: Dec. 15, 2017

(65) Prior Publication Data

US 2019/0187199 A1    Jun. 20, 2019

(51) Int. Cl.
*H04B 17/00* (2015.01)
*G01R 29/10* (2006.01)
*H04B 17/29* (2015.01)
*H04B 17/15* (2015.01)

(52) U.S. Cl.
CPC .......... *G01R 29/10* (2013.01); *H04B 17/15* (2015.01); *H04B 17/29* (2015.01)

(58) Field of Classification Search
CPC ......... G01R 29/10; H04B 17/15; H04B 17/29
See application file for complete search history.

(56) References Cited

U.S. PATENT DOCUMENTS

| 9,964,577 B2 | 5/2018 | Qi et al. | |
| 2011/0270567 A1* | 11/2011 | Mow | H04B 17/0087 702/120 |
| 2018/0027434 A1* | 1/2018 | Foegelle | H04B 7/0617 455/67.13 |

OTHER PUBLICATIONS

Huawei, "Discussion of mmWave UE EIRP and EIS test", R4-1700095, 3GPP TSG-RAN W4G NR AH Meeting, Spokane, WA, USA, Jan. 17-19, 2017, Jan. 17, 2017.

(Continued)

*Primary Examiner* — Xin Jia
(74) *Attorney, Agent, or Firm* — Potomac Technology Law, LLC (57) ABSTRACT

A test system for over the air (OTA) measurements of transceiver performance metrics of a device under test is provided. The test system comprises a device under test (DUT), at least one positioning device, at least one measurement antenna, and at least one measuring/control processor. The at least one measurement antenna is configured to establish a data link to the DUT and to transmit/receive test data to/from the DUT via the data link. The at least one positioning device is configured to adjust the position of the at least one measurement antenna around the DUT to specific measurement points, wherein the specific measurement points are distributed randomly around the DUT.

20 Claims, 5 Drawing Sheets

(56) References Cited

OTHER PUBLICATIONS

Huawei, "On CDF test point placement on sphere surface", R4-1701335, 3GPP TSG-RAN WG4 Meeting #82, Athens, Greece, Feb. 13-17, 2017, Feb. 13, 2017.
Marsaglia, "Choosing a Point From the Surface of a Spere", The Annals of Mathematical Statistics, McGill Univ., vol. 43, No. 2, pp. 645-646, 1972, 1972.
Rohde & Schwarz, "OTA Performance Test System", Rohde & Schwarz, Product Brochure, R&S TS8991, OTA Performance Test System, Single-source turnkey solutions for cellular and non-cellular wireless testing, Oct. 2016.
CTIA, "Test Plan for Wireless Device Over-the-Air Performance", CTIA Everything Wireless, The Wireless Association, Ver. 3.7, https://ctia.org/docs/default-source/certification/ctia-test-plan-for-wireless-device-over-the-air-performance-ver-3-6-1.pdf?sfvrsn=4, Jun. 2017, Sect. 2, pp. 30-34.

* cited by examiner

TEST SYSTEM AND METHOD FOR OVER THE AIR (OTA) MEASUREMENTS BASED ON RANDOMLY ADJUSTED MEASUREMENT POINTS

TECHNICAL FIELD

The present invention relates to a test system and a method for over the air (OTA) measurements of transceiver performance of a device under test (DUT) with randomly adjustable measurement points, the system comprising a measurement antenna, a positioner and a measuring/control device.

BACKGROUND

Generally, wireless enabled devices have to pass a variety of industry and regulatory certifications before they can be put on the market. The certifications include regulatory/compliance testing such as EMC (Electro Magnetic Compatibility), conformance testing such as protocol, Radio Frequency (RF), Radio Resource Management (RRM) and Location Based Services (LBS), as well as performance testing such as over the air (OTA) measurements. Up to the 4th generation of mobile communication, commonly known as Long Term Evolution (LTE), conformance measurements including receiver performance assessment, are based on conducted measurements, assuming the availability of appropriate connectors. Only a very few measurements, such as the Total Radiated Power (TRP) and the Total Isotropic Sensitivity (TIS), are additionally specified for OTA measurement environments.

When looking towards the next generation of mobile communications (e.g., the 5th generation) the need for OTA testing increases, since frequencies far beyond the spectrum that has been used so far for mobile communications are being considered by the standardization body 3GPP. Basically no frequency up to 100 GHz shall be precluded, in particular operating frequencies in the 28 GHz range are of significant interest.

Such high operating frequencies require high gain antenna implementations to overcome the increased free space path loss, and consequently antenna array deployments rather than single antenna elements will be seen in the new generation of mobile devices. Performing conducted measurements with several antennas is not practical and therefore more and more measurements have to be performed over the air. Since more and more different antenna array deployments for different devices under test (DUTs) are seen, a measurement setup and method is desired for conducting OTA performance testing for a variety of DUTs having different antenna array deployments and properties.

The document "Test Plan for Wireless Device over-the-Air performance," Version 3.7, by the Cellular Telecommunications Industry Association (CTIA)—The Wireless Association, issued in June 2017 on www.ctia.org/certification, relates to testing of wireless devices and defines test requirements for performing radiated radio frequency (RF) power and receiver performance measurements on wireless devices. This document is incorporated herein by reference. Section 5 of the document describes several test procedures for the radiated power measurement of a DUT. Section 6 of the document is related to several test procedures for measuring the receiver performance of a DUT. The test procedures consider different mobile radio standards, such as Universal Mobile Telecommunications System (UMTS), Global System for Mobile Communications (GSM) and Long Term Evolution (LTE).

Further, the test procedures contain requirements regarding requirements for performing spherical scans for transceiver testing. The document additionally specifies the sequence of measurement points for transmitter testing and receiver testing. Appendix A and figures A27 to A33 of the cited document disclose different test setups for transceiver performance measurements of a DUT. The cited document, however, does not consider the 5th generation of mobile radio standards, which requires improved measurement procedures to take into account the higher frequencies used with the 5th generation of mobile radio standards and the more complex and diverse antenna array deployments.

Accordingly, there is a need for a test system and a method for improving the measurement process of DUTs, such as mobile devices designed for use with the 5th generation of mobile standards. The test system should be able to perform testing on different DUTs (e.g., mobile phones) without any knowledge about specific device configurations, such as antenna array implementation. In other words, the test system should be capable of performing a "black box" testing for a variety of different DUTs with different antenna array implementations.

SOME EXAMPLE EMBODIMENTS

Embodiments of the present invention advantageously address the foregoing requirements and needs, as well as others, by providing a test system and a method for improving the measurement process of devices under test (DUTs), such as mobile devices designed for use with the 5th generation of mobile standards. The test system according to example embodiments is configured to perform testing on different DUTs without knowledge regarding specific device configurations, such as antenna array implementation—the test system according to example embodiments is designed to perform "black box" testing for a variety of different DUTs with different antenna array implementations.

According to a first aspect of the invention, a test system for over the air (OTA) measurements of transceiver performance metrics of a device under test is provided. The system comprises a device under test (DUT), at least one positioner, at least one measurement antenna, and at least one measuring/control device or measuring controller or processor. The at least one measurement antenna is configured to establish a data link to the DUT and to transmit or receive test data to or from the DUT via the data link. The at least one positioner is configured to adjust the position of the at least one measurement antenna around the DUT to specific measurement points, wherein the specific measurement points are distributed randomly.

Advantageously, the random adjustment of measurement points allows a kind of "black box" testing of various DUTs with different antenna array implementations and different properties (e.g., different radiation patterns). For certain radiation patterns, certain measurement points are not meaningful. Therefore, a random selection of measurement points ensures that transceiver performance measurement results for the various DUTs are independent from the selected measurement points.

According to a first implementation form of the first aspect, a start measurement antenna position is adjusted randomly and/or at least one further measurement antenna position following the start measurement antenna position is adjusted randomly.

Advantageously, based on previous measurements of a similar DUT, it is sufficient to randomly select the start measurement point and continue with a defined measurement point sequence. However, it is also conceivable to randomly select several measurement points following a randomly selected start measurement point or following a predefined start measurement point.

According to a further implementation form of the first aspect, the measurement antenna position is defined by azimuth angle and elevation angle with respect to the DUT.

Advantageously, the measurement antenna is movable around the DUT in 3-dimensional space. By adjusting azimuth and elevation angle with respect to the DUT, the position of the measurement antenna around the DUT can be easily set. It is also conceivable to determine the position of the measurement antenna around the DUT in a Cartesian Coordinate System by setting x, y and z coordinates or by any other suitable coordinate system.

According to a further implementation form of the first aspect, the number of measurement points is a predefined value or the number of measurement points is a randomly selected value within a predefined range.

Advantageously, the number of measurement points, in other words the number of measurements to be performed, can be a predefined value, which is suitable when information regarding the DUT is already present. Based on previous measurements of a similar DUT or due to previous testing of the same DUT, an appropriate number of measurement points can be determined. It is also conceivable that the number of measurement points or the range within a random number of measurement points is determined based on a desired measurement time or on the available computational performance.

According to a further implementation form of the first aspect, the measuring/control device is configured to receive test data measured by the DUT at a specific measurement point and to determine receiver performance metrics of the DUT. In addition, the measuring control device is configured to receive test data measured by the measurement antenna at a specific measurement point and to determine transmitter performance metrics of the DUT.

Advantageously, the measurement/control device is capable of performing the functionality of a base station simulator respectively a base station emulator to configure the measurement antenna to emit radiation patterns including test data to measure receiver performance metrics of the DUT. Further, the measurement/control device is capable of controlling the DUT to emit radiation patterns including test data to measure transmitter performance metrics of the DUT. The measurement setup allows for testing of receiver and transmitter metrics. Due to the base station functionality, the system can easily perform measurements of different DUTs with different mobile radio standards and different technologies.

According to a further implementation form of the first aspect, the measuring/control device defines one or more thresholds and indicates if receiver and/or transmitter performance metrics are above or below the one or more thresholds.

Advantageously, a threshold value for receiver performance measurement is an error rate value respectively a Bit-Error Rate (BER) to determine the receiver sensitivity.

According to a further implementation form of the first aspect, the measurement points are arranged on a grid around the DUT.

Advantageously, defining a grid on which measurement points are arranged, reduces the number of possible measurement points and reduces measurement time and computational effort. For certain measurements of transceiver metrics it is sufficient to measure only at measurement points arranged on a grid and not having the option to measure at any point around the DUT. A defined grid is also useful for comparing different measurements of different DUTs.

According to a further implementation form of the first aspect, each specific measurement antenna position is adjusted from a current measurement point on the grid to a neighboring measurement point on the grid.

Advantageously, the option to select a neighboring measurement point of a current measurement point as the next measuring point is useful in case measurement values around a current measurement point are of interest. It is conceivable that a measured value at a certain point is close to a threshold value and therefore the neighboring measurement values are of interest, for example to verify if these measurement values are above or below a certain threshold.

According to a further implementation form of the first aspect, a configuration of the grid is such that a density of the grid is adjustable and can be decreased or increased and/or that a configuration of the grid is such that a distribution of the measurement points arranged on the grid around the DUT is adjustable.

Advantageously, a denser measurement grid allows increasing the number of measurement points to increase measurement accuracy. A less dense grid allows decreasing the number of measurement points to decrease measurement time. To improve the measurement accuracy at a certain region of interest and to reduce the measurement accuracy at non interesting areas, the configuration of the grid can be accordingly adjusted. This allows increasing the measurement accuracy at a defined area of interest due to an increased number of measurement points and decreasing the number of measurement points at areas of no interest.

According to a further implementation form of the first aspect, the positioner adjusts the measurement points arranged on a grid around the DUT in a random order.

Advantageously, the adjustment of measurement points is not performed by measuring points arranged on a grid in a predefined order, for example, by measuring in 5-30° increments for every elevation and azimuthal angle, but by randomly selecting measurement points arranged on the grid. A random selection of measurement points is more suitable for performing transceiver performance measurements on a variety of DUTs having different properties, especially different antenna array implementations. A predefined set of measurement points is appropriate for a certain type of DUT but not for all possible DUTs that have to be tested.

According to a further implementation form of the first aspect, the DUT is positioned in a far-field region of the measurement antenna and/or wherein the at least one measurement antenna is an antenna array consisting of several antenna elements.

According to a further implementation form of the first aspect, a movement of the measurement antenna moved by the positioner does not stop at a specific measurement point and the measurement of transceiver performance metrics is done during the movement of the positioner.

Advantageously, measuring transceiver performance metrics at a specific measurement points without stopping at that point, decreases measurement time.

According to a further implementation form of the first aspect, a movement of the measurement antenna moved by the positioner stops at least at one measurement point to perform a transceiver performance metrics measurement.

Advantageously, measuring transceiver performance metrics at a specific measurement point by stopping at the specific measurement point reduces computational effort and increases measurement accuracy.

According to a second aspect of the invention, a method for over the air (OTA) measurements of transceiver performance of a device under test (DUT) is provided. The method comprises the steps of configuring at least one measurement antenna to establish a data link to the DUT and to transmit or receive test data to or from the DUT with the aid of a measuring/control device or measuring controller or processor. Further, the method comprises the step of configuring the DUT to transmit or receive test data to or from the measurement antenna with the aid of the measuring/control device. In addition, the method comprises configuring at least one positioner to adjust the position of the measurement antenna around the DUT to specific measurement points with the aid of the measuring/control device, and randomly selecting the specific measurement positions with the aid of the measuring/control device.

According to a first implementation form of the second aspect, the method further comprises the step of randomly adjusting a start measurement antenna position and/or the step of randomly adjusting at least one further measurement antenna position following on the start measurement antenna position.

Advantageously, a random adjustment of the measurement antenna position to specify measurement points is more suitable for performing transceiver performance measurements on a variety of DUTs with different properties and antenna implementations. A certain predefined set of measurement points will be suitable only for a limited number of DUTs. It is impractical to determine a sequence of measurement points for each different DUT. Since a detailed construction of the antenna array implementation of a DUT is not necessarily known, it is hardly possible to determine an appropriate set of measurement points for each DUT.

According to a further implementation form of the second aspect, the method further comprises the step of adjusting the elevation and/or azimuth angle of the measurement antenna to adjust the measurement antenna position with respect to the DUT, and/or the step of arranging measurement points on a grid around the DUT.

According to a further implementation form of the second aspect, the method further comprises the step of processing test data received from the DUT respectively received from the measurement antenna at the specific measurement points with the aid of the measuring/control device.

According to a further implementation form of the second aspect, the method further comprises the step of determining receiver/transmitter performance metrics out of the processed test data with the aid of the measurement/control device.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Embodiments of the present invention are illustrated by way of example, and not by way of limitation, in the figures of the accompanying drawings, in which like reference numerals refer to similar elements, and in which.

DETAILED DESCRIPTION

A test system and a method for improving the measurement process of devices under test (DUTs), such as mobile devices designed for use with the 5th generation of mobile standards, are described. The test system according to example embodiments is configured to perform testing on different DUTs without knowledge regarding specific device configurations, such as antenna array implementation—the test system according to example embodiments is designed to perform "black box" testing for a variety of different DUTs with different antenna array implementations. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

As will be appreciated, a processor, unit, module or component (as referred to herein) may be composed of software component(s), which are stored in a memory or other computer-readable storage medium, and executed by one or more processors or CPUs of the respective devices. As will also be appreciated, however, a module or unit may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in a computer memory store.

Figure 1:
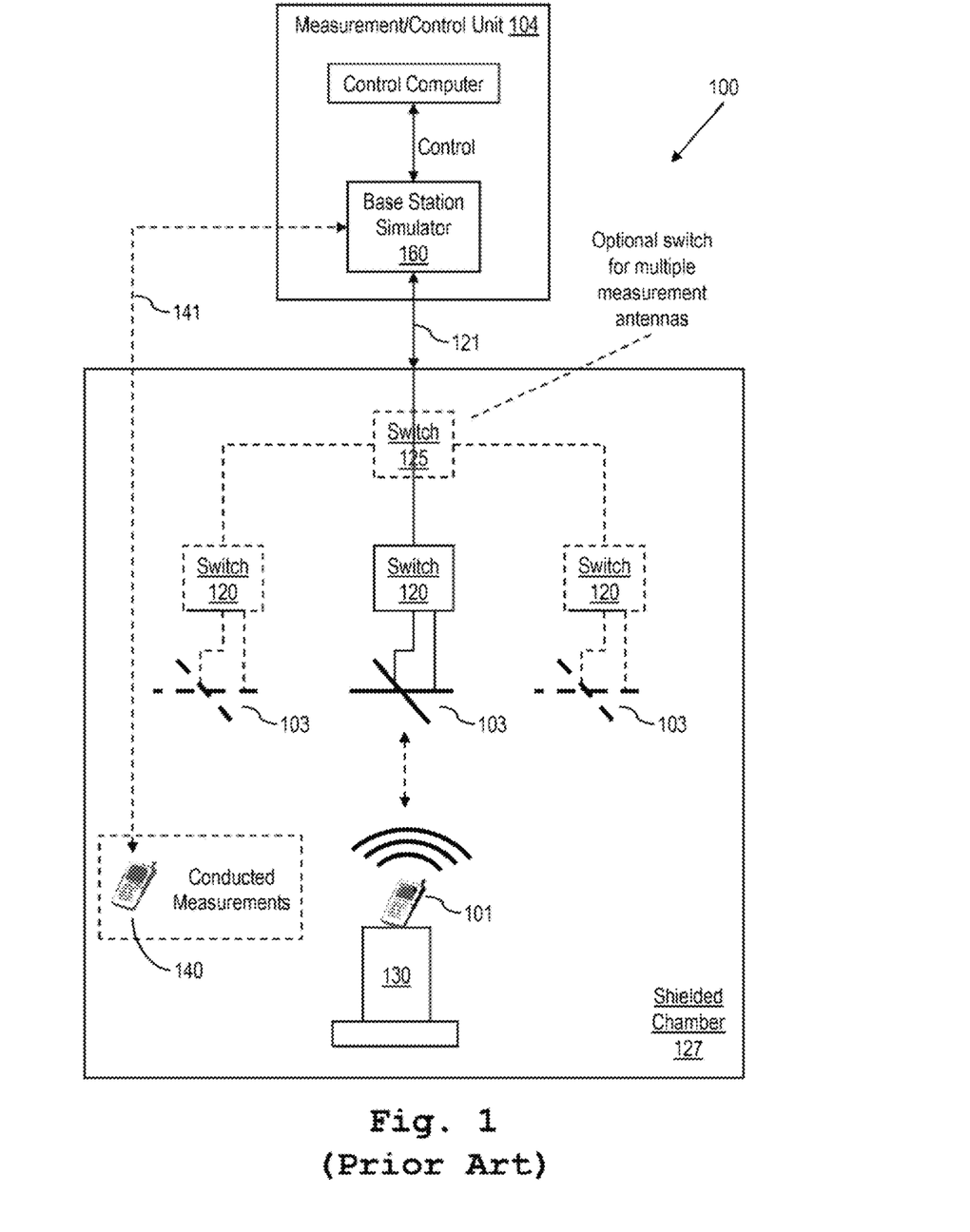
FIG. 1 shows a block diagram of a prior art measurement setup for measuring transceiver performance metrics of a device under test.

FIG. 1 shows a block diagram of a prior art measurement setup 100 for measuring transceiver performance metrics of a device under test (DUT) 101, such as total radiated power TRP and TIS of the DUT.

Total radiated power (TRP) is a measure of how much power is radiated by an antenna when the antenna is connected to an actual radio or transmitter. The total received power is calculated and summed up over all possible angles, for example azimuth and elevation angle, in other words summed up over all specified measurement points.

A typical receiver performance metric is the total isotropic sensitivity (TIS), which indicates the total available receiver performance of a DUT with a real antenna. A single TIS result is based on the sum of measurements over all specified measurement points.

The measurement setup 100 includes a DUT 101, a support 130 on which the DUT 101 is placed, a positioning device (not shown), and at least one measurement antenna 103 connected to a switch 120 to set a horizontal (θ) or vertical polarization (φ), since certification standards often require measurements in these 2 polarizations. The switch 120 is configured to set the polarization, and is further connected to an optional switch 125 for switching between multiple optional measurement antennas 103. All mentioned components are located within an anechoic chamber 127, which is designed to be non-reflective and echo-free. The optional switch 125 is connected via a cable connection 121 to a base station simulator 160 that is part of a measurement/control unit 104 to transmit electrical signals from the base station simulator 160 to the specified measurement antennas 103, and to transmit electrical signals received by a measurement antenna 103 to the base station simulator 160. Additionally, FIG. 1 shows a DUT 140 that is connected to the base station simulator 160 via cable connection 141. The conducted measurement of the DUT 140 shown in FIG. 1, however, is not further described herein, since the focus of embodiments of the present invention is on OTA measurements.

For testing the transmitter performance of the DUT 101, the base station simulator 160 configures the DUT 101 to emit electromagnetic radiation with a certain output power and a certain radiation pattern. A spherical scan around the DUT 101 is conducted by moving the measurement antenna 103 around the DUT 101 in the azimuth direction by adjusting the azimuth angle phi (φ) and in the elevation direction by adjusting the elevation angle theta (θ). Typically, each transmit-test spherical scan contains measurements for 11 theta cuts, 24 phi cuts, and two polarizations. Based on samples measured for example every 15 degrees of rotation for each cut, for example 528 measurements are taken for one complete transmit test.

For testing the receiver performance of the DUT 101, the base station simulator 160 configures the measurement antenna 103 to emit electromagnetic radiation with a certain power and a certain radiation pattern to generate data traffic. The DUT 101 is configured to receive the data traffic and to determine the Bit Error Rate (BER) or any other suitable value of the received signals. The output power, with which the data traffic is sent, is lowered until a predefined threshold error rate is reached, which represents the receiver sensitivity. By moving the measurement antenna 103 around the DUT 101 in the azimuth direction by adjusting the azimuth angle phi (φ) and in the elevation direction by adjusting the elevation angle theta (θ), a spherical scan around the DUT 101 is conducted. Each receive-test spherical-scan typically contains measurements for 5 theta cuts, 12 phi cuts and 2 polarizations. Based on samples measured for example every 30 degrees of rotation for each cut, for example 120 measurements are performed for a complete receive test. All of these measurements are combined using calculations defined in specific test procedures to form a single TIS result per frequency.

Detailed requirements for testing of TIS and TRP are provided in the above-referenced CTIA document "Test Plan for Wireless Device over-the-Air performance."

Figure 2:
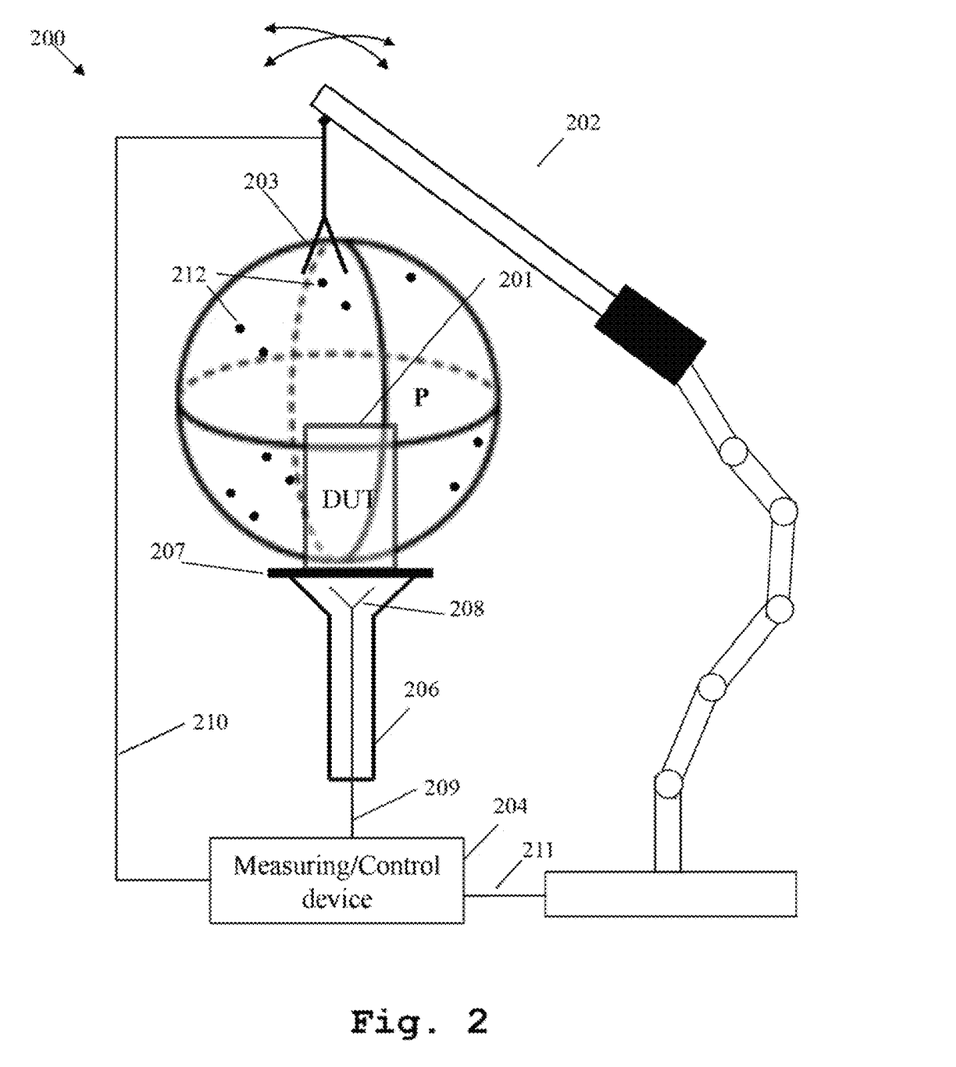
FIG. 2 shows a block diagram of a test system for over the air measurements of transceiver performance metrics of a device under test based on randomly adjusted measurement points, in accordance with example embodiments of the present invention.

FIG. 2 shows a block diagram of a test system 200 for over the air (OTA) measurements of transceiver performance metrics of a device under test (DUT) based on randomly adjusted measurement points, in accordance with example embodiments of the present. The present invention is not limited to this embodiment and all features below are explained for the purpose of example only.

The test system 200 comprises a DUT 201, a measurement antenna 203, a link antenna 208, a positioner 202 and a measuring/control device or measuring/control processor 204, connected to the link antenna 208 via a cable connection 209 and connected to the measurement antenna 203 via a cable connection 210. Further, a shielding 206, 207 of the link antenna 208 is included in the test system 200.

According to one example embodiment, the test setup components, such as the DUT, antennas and positioner, are located within a shielded anechoic chamber (not shown in FIG. 2).

According to a further example embodiment, the DUT 201 may include a test interface to input/receive beam steering data and/or communication data to/from the measurement antenna 203.

According to a further example embodiment, the measurement antenna 203 may be a single horn-antenna that is movable in all directions around the DUT with the aid of the positioner 202. Arm positioners or robotic arms to provide this functionality are well known to the person skilled in the art and are therefore not described in detail within this document.

The link antenna 208 is configured to exchange communication data generated by the measuring/control device 204 and/or by the DUT 201 between DUT and measuring/control device. The shielding 206, 207 of the link antenna 203 prevents radiation generated by the link antenna 208 from being received by the measurement antenna 203 and adversely affecting the measurement result of the OTA measurements.

According to a further example embodiment, a plate on which the DUT is positioned can be rotated and/or tilted.

According to a further example embodiment, several antenna elements may be provided to form an antenna array, which would emulate the function of mechanical movement of the measurement antenna 203.

The measuring/control device 204 is configured to perform a base station simulator/emulator functionality and to control the DUT 201 to emit electromagnetic radiation with a certain power and a certain radiation pattern. The measuring/control device 204 is further configured to adjust the position of the measurement antenna 203 around the DUT 201 to specify randomly distributed measurement points 212. By way of example, the randomly distributed measurement points 212 can be generated by randomly adjusting the azimuth angle (phi—φ) and the elevation angle (theta—θ). The measuring/control device 204 further configured to control the measurement antenna 203 to perform measurements of the electromagnetic radiation emitted by the DUT 201 at the randomly adjusted measurement points 212. Based on the performed measurements the TRP is calculated, for example, by the measuring/control device 204.

The measuring/control device 204 is further capable of configuring the measurement antenna 203 to emit electromagnetic radiation with a certain output power and a certain radiation pattern including data traffic. The DUT 201 is configured to receive the data traffic and to determine for example the Bit Error Rate (BER) of the received signal. The measuring/control device 204 is further configured to control the measurement antenna 203 to lower the output power of the emitted electromagnetic radiation until a predefined threshold BER is determined by the DUT 201. The positioner 202 is configured to adjust the position of the measurement antenna 203 around the DUT 201 to specific measurement points. The specific measurement points are randomly distributed measurement points 212. For the calculation of a single TIS result all measurements performed by the DUT 201 for each specified measurement point 212 may be considered.

Figure 3:
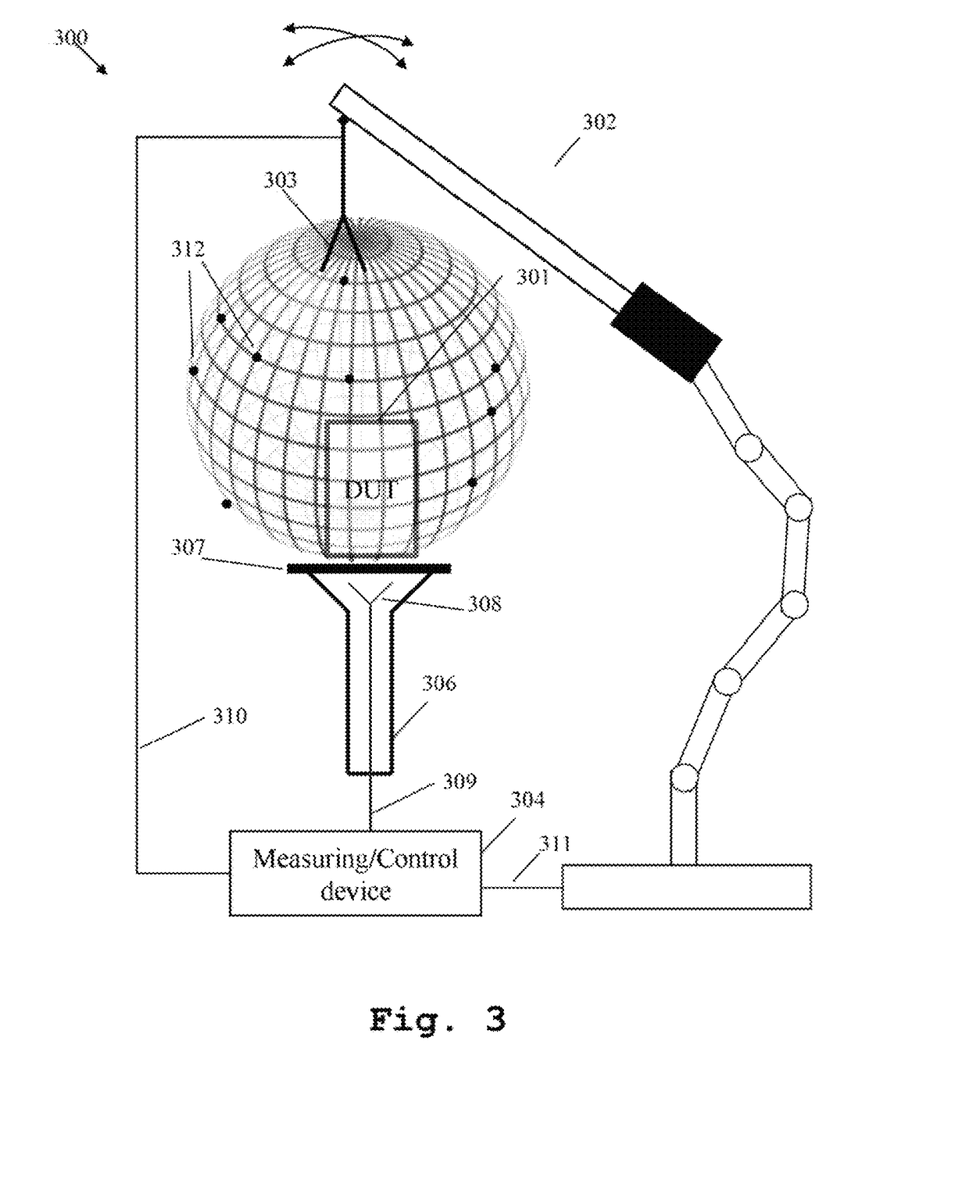
FIG. 3 shows a test system for over the air measurements of transceiver performance metrics of a device under test based on randomly adjusted measurement points arranged on a defined grid, in accordance with example embodiments of the present invention.

FIG. 3 shows a test system 300 for over the air measurements of transceiver performance metrics of a device under test based on randomly adjusted measurement points arranged on a defined grid, in accordance with example embodiments of the present invention. The test system 300 of FIG. 3 is identical to the test system 200 of FIG. 2, except that the test system 300 shows randomly distributed measurement points 312 arranged on a grid.

The positioner 302 is controlled such that the measurement points 312 are arranged on a grid around the DUT 301. By way of example, the grid density as well as the type of grid can be varied. Only the measurement points 312 arranged on the grid are randomly selected.

Figure 4A:
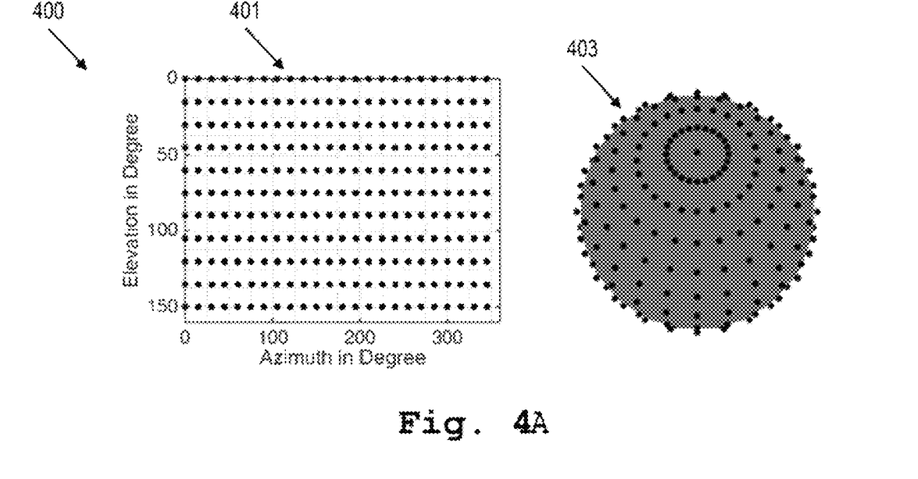
FIG. 4A shows a constant step size measurement grid as an azimuth/elevation representation and as a sphere representation, in accordance with example embodiments of the present invention.
Figure 4B:
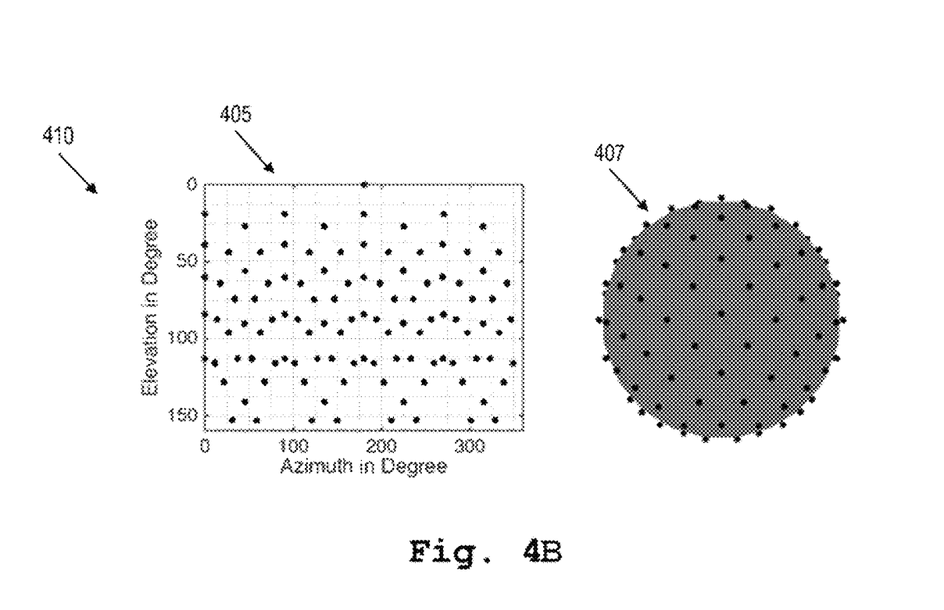
FIG. 4B shows a constant density measurement grid as an azimuth/elevation representation and as a sphere representation, in accordance with example embodiments of the present invention.

FIG. 4A shows a constant step size measurement grid 400 as an azimuth/elevation representation 401 and as a sphere representation 403, in accordance with example embodiments of the present invention. The sphere representation 403 shows measurement points non-uniformly distributed on the sphere surface—at the poles the measurement points are denser than near the equator, whereas the same grid 401 drawn in azimuth/elevation representation has uniformly distributed measurement points. FIG. 4B shows a constant density measurement grid 410 as an azimuth/elevation representation 405 and as a sphere representation 407, in accordance with example embodiments of the present invention. The sphere representation 407 shows measurement points uniformly distributed on the sphere surface, whereas the azimuth/elevation representation 405 has non-uniformly distributed measurement points. FIGS. 4A and 4B present two examples of different possible measurement distributions in different representations. Embodiments of the present invention, however, are not limited to the representations of FIGS. 4A and 4B, and any other measurement point distribution is conceivable.

Figure 5:
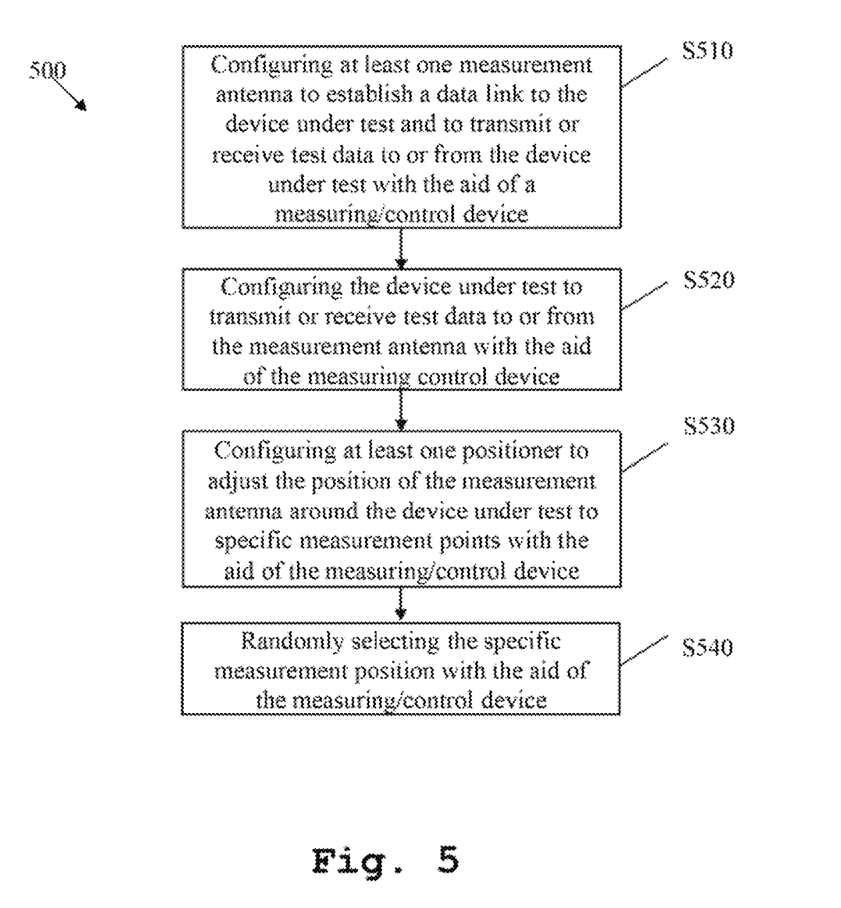
FIG. 5 shows a flow chart of a method for over the air measurements of transceiver performance of a device under test, in accordance with example embodiments of the present invention.

FIG. 5 shows a flow chart 500 of a method for over the air measurements of transceiver performance of a device under test, in accordance with example embodiments of the present invention. In step S510, at least one measurement antenna 203, 303 establishes a data link to the DUT 201, 301, and transmits or receives test data to or from the DUT 201, 301, for example, with the aid of a measuring/control device 204, 304. The measuring/control device 204, 304, for example, is configured to perform a base station simulation/emulation functionality to generate appropriate test signals and to receive test signal from a DUT 201, 301.

In step S520, the DUT 201, 301 transmits or receives test data to or from the measurement antenna 203, 303, for example, with the aid of the measuring/control device 204, 304. The base station simulator/emulator functionality of the measuring/control device 204, 304 allows transceiver performance testing of the DUT 201, 301 with different parameters, at various frequency bands. This allows performing testing as required in applicable test procedures.

In step S530, at least one positioner 202, 302 adjusts the position of the measurement antenna 203, 303 around the DUT 201, 301 to specific measurement points 212, 312, for example, with the aid of the measuring/control device 204, 304. The measurement antenna 203, 303 is thereby movable around the DUT 201, 301 in 3-dimensional space. It is also conceivable that the DUT 201, 301 is rotated in an azimuth direction and the measurement antenna 203, 303 is moved in an elevation direction.

In step S540 the specific measurement position is adjusted randomly, for example, with the aid of the measuring control/device 204, 304 and the positioner 202, 302. The random adjustment of measurement points 212, 312 around the DUT 201, 301 allows testing of different DUTs, having different antenna array implementations and properties. Since the measurement points are adjusted in random order, no specific antenna array implementation is favored and measuring the transceiver performance of various, different DUTs is not influenced by a predefined set of measurement points.

While various embodiments of the present invention have been described above, it should be understood that they have been presented by way of example only, and not for limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A test system for over the air (OTA) measurements of transceiver performance metrics of a device under test, comprising:
   a device under test (DUT);
   at least one positioning device;
   a link antenna;
   at least one measurement antenna; and
   at least one measuring/control processor; and
   wherein the at least one measurement antenna is configured to establish a data link to the DUT and to transmit or receive test data to or from the DUT via the data link,
   wherein the at least one positioning device is configured to adjust a position of the at least one measurement antenna around the DUT to specific measurement points, wherein one or more of the specific measurement points are distributed around the DUT randomly, and wherein the link antenna is shielded and configured to exchange communication data between the measuring/control processor and the DUT.

2. The test system according to claim 1, wherein one or more of a start measurement antenna position and at least one further measurement antenna position following the start measurement antenna position is/are adjusted randomly.

3. The test system according to claim 1, wherein at least one of the measurement points is defined by an azimuth angle and an elevation angle with respect to the DUT.

4. The test system according to claim 1, wherein the number of measurement points is one of a predefined value or a randomly selected value within a predefined range.

5. The test system according to claim 1, wherein the measuring/control processor is configured to receive test data measured by the DUT at a specific measurement point and to determine receiver performance metrics of the DUT, and wherein the measuring/control processor is configured to receive test data measured by the measurement antenna at a specific measurement point and to determine transmitter performance metrics of the DUT.

6. The test system according to claim 5, wherein the measuring/control processor is configured to define one or more threshold values and to determine if the receiver and/or transmitter performance metrics are above or below the one or more threshold values.

7. The test system according to claim 5, wherein the adjustment of the measurement antenna by the positioner does not stop at the specific measurement point and the measurement by the measurement antenna is performed during the adjustment of the measurement antenna.

8. The test system according to claim 1, wherein the measurement points are arranged on a grid around the DUT.

9. The test system according to claim 8, wherein each measurement antenna position is adjusted from a current measurement point on the grid to a neighboring measurement point on the grid.

10. The test system according to claim 8, wherein a density of the grid is adjustable, and/or wherein a distribution of the measurement points on the grid around the DUT is adjustable.

11. The test system according to claim 8, wherein the positioning device is configured to adjust the measurement points on the grid around the DUT in a random order.

12. The test system according to claim 1, wherein the DUT is positioned in a far-field region of the measurement antenna.

13. The test system according to claim 1, wherein the at least one measurement antenna comprises an antenna array consisting of several antenna elements.

14. The test system according to claim 1, wherein adjustment of the measurement antenna by the positioner stops at the specific measurement point for the measurement by the measurement antenna.

15. A method for over the air (OTA) measurements of transceiver performance of a device under test (DUT), the method comprising:

establishing a data link between at least one measurement antenna and the DUT;

performing one of transmitting first test data from the at least one measurement antenna to the DUT or receiving second test data from the DUT by the at least one measurement antenna;

performing one of receiving the first test data by the DUT or transmitting the second test data from the DUT to the at least one measurement antenna;

adjusting a position of the at least one measurement antenna around the DUT to specific measurement points, wherein one or more of the specific measurement points are distributed around the DUT randomly; and exchanging communication data, via a link antenna, between the measuring/control processor and the DUT, wherein the link antenna is shielded.

16. The method according to claim 15, further comprising:

randomly adjusting one or more of a start measurement antenna position and at least one further measurement antenna position following the start measurement antenna position.

17. The method according to claim 15, wherein at least one of the measurement points is defined by an azimuth angle and an elevation angle with respect to the DUT.

18. The method according to claim 15, wherein the measurement points are arranged on a grid around the DUT.

19. The method according to claim 15, further comprising:

processing the second test data received by the at least one measurement antenna from the DUT at the specific measurement points.

20. The method according to claim 19, further comprising:

determining one or more of receiver and transmitter performance metrics of the DUT based on the processing of the second test data.

* * * * *